(12) United States Patent
Lach

(10) Patent No.: US 9,762,037 B1
(45) Date of Patent: Sep. 12, 2017

(54) HIGH CURRENT BUSBAR SYSTEM FOR LOW-PROFILE POWER SHELVES

(71) Applicant: PAI Capital LLC, Santa Clara, CA (US)

(72) Inventor: Marek Lach, Uster (CH)

(73) Assignee: Bel Power Solutions Inc., Santa Clara, CA (US)

( * ) Notice: Subject to any disclaimer, the term of this patent is extended or adjusted under 35 U.S.C. 154(b) by 0 days.

(21) Appl. No.: 14/973,873

(22) Filed: Dec. 18, 2015

Related U.S. Application Data

(60) Provisional application No. 62/101,430, filed on Jan. 9, 2015.

(51) Int. Cl.
| | |
|---|---|
| *H02B 1/56* | (2006.01) |
| *H02B 1/20* | (2006.01) |
| *H02G 5/02* | (2006.01) |
| *H01R 25/14* | (2006.01) |
| *H05K 7/14* | (2006.01) |
| *G06F 1/18* | (2006.01) |

(52) U.S. Cl.
CPC ............... *H02B 1/56* (2013.01); *H02B 1/20* (2013.01); *H02G 5/025* (2013.01); *G06F 1/189* (2013.01); *H01R 25/142* (2013.01); *H05K 7/1492* (2013.01)

(58) Field of Classification Search
CPC ... H02B 1/20; H02B 1/04; H02B 1/56; H01R 9/2608; H01R 9/2691; H01R 25/14; H01R 25/142; G06F 1/189; H05K 7/1492; H02G 5/025

USPC .......................................................... 439/110
See application file for complete search history.

(56) References Cited

U.S. PATENT DOCUMENTS

| | | |
|---|---|---|
| 6,650,535 B1 | 11/2003 | Moss et al. |
| 6,650,537 B2 | 11/2003 | Pereira et al. |
| 6,721,188 B1 | 4/2004 | Jarvis et al. |
| 6,829,141 B2 | 12/2004 | Garnett et al. |
| 7,068,509 B2 | 6/2006 | Bash et al. |
| 7,231,961 B2 | 6/2007 | Alex et al. |
| 7,283,358 B2 | 10/2007 | Campbell et al. |
| 7,535,707 B2 | 5/2009 | Seibold |
| 7,804,686 B2 | 9/2010 | Parish et al. |
| 8,472,183 B1 | 6/2013 | Ross et al. |

(Continued)

FOREIGN PATENT DOCUMENTS

WO    2013152982 A2    10/2013

*Primary Examiner* — Zachary M Pape
(74) *Attorney, Agent, or Firm* — Patterson Intellectual Property Law, P.C.; Mark J. Patterson; Gary L. Montle

(57) ABSTRACT

A low profile (1U) power distribution system includes a power shelf assembly having a first side and an opposing second side. First and second bus bars extend across the assembly and substantially in parallel with the first and second sides, the second bar positioned behind the first bar. One row of power supply pins extends from the bars to engage power supply units within the assembly. A first set of pins extends from the first bus, while a second set extends from the second bar and protruding through respective apertures in the first bar. An insulating material may be provided to electrically insulate power supply pins of the second bar from the first bar. The reduced height profile of the bars allows for cooling air to pass through the remaining >50% of the assembly, which may now desirably include additional electrical circuits within the cooling channel.

15 Claims, 8 Drawing Sheets

(56) References Cited

U.S. PATENT DOCUMENTS

| | | | |
|---|---|---|---|
| 8,616,902 B2 * | 12/2013 | Li | H01R 25/16 439/110 |
| 8,638,553 B1 | 1/2014 | Czamara et al. | |
| 8,793,516 B2 * | 7/2014 | Li | G06F 1/188 307/154 |
| 8,917,493 B2 * | 12/2014 | Wang | H05K 7/1492 174/149 B |
| 2007/0145872 A1 | 6/2007 | Huang | |
| 2012/0243172 A1 | 9/2012 | Ross et al. | |
| 2013/0017699 A1 * | 1/2013 | Li | G06F 1/188 439/212 |
| 2013/0107436 A1 * | 5/2013 | Li | H05K 7/1492 361/679.4 |
| 2015/0177808 A1 | 6/2015 | Sarti | |

* cited by examiner

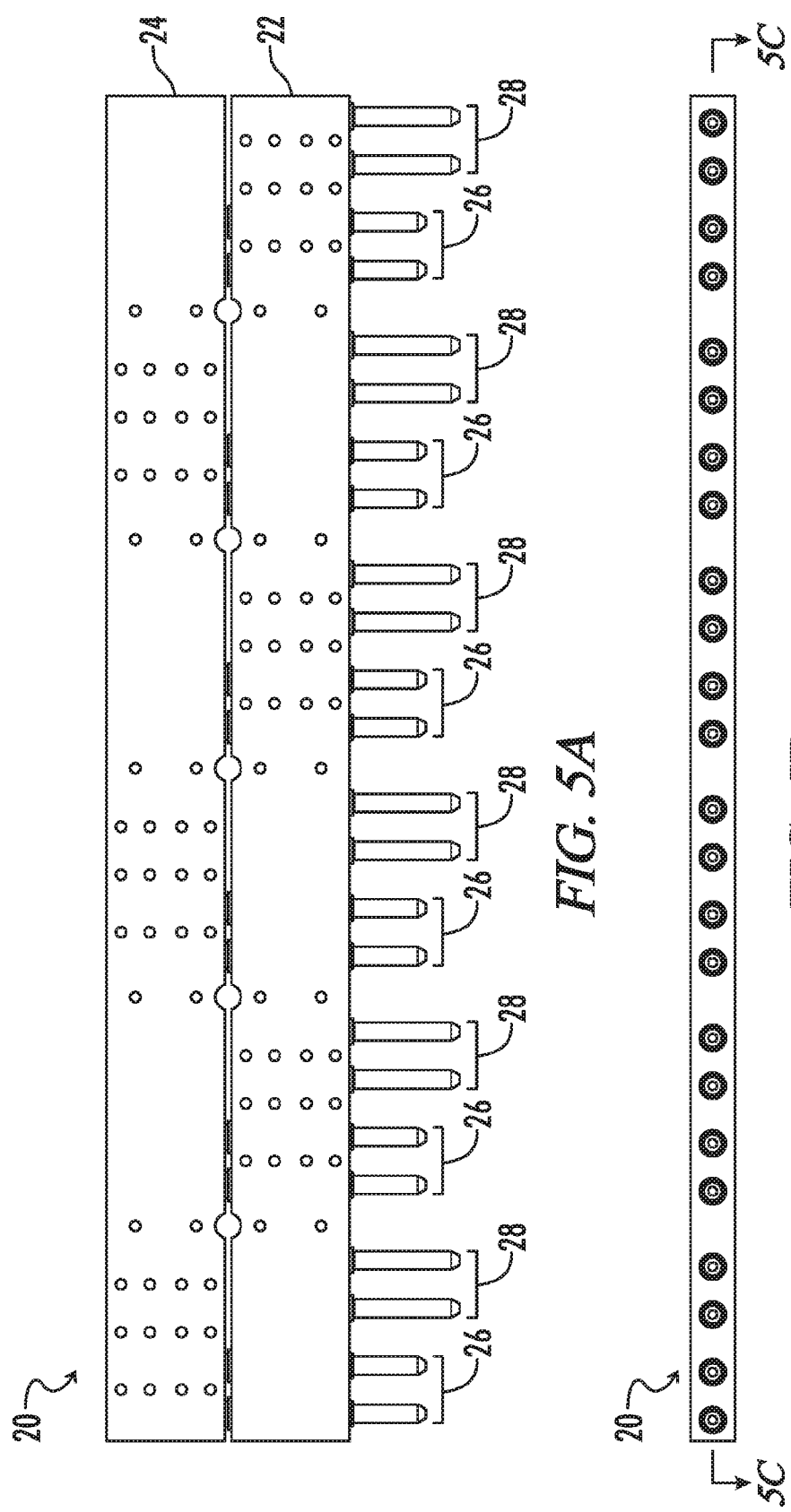

HIGH CURRENT BUSBAR SYSTEM FOR LOW-PROFILE POWER SHELVES

A portion of the invention of this patent document contains material that is subject to copyright protection. The copyright owner has no objection to the reproduction of the patent document or the patent invention, as it appears in the U.S. Patent and Trademark Office patent file or records, but otherwise reserves all copyright rights whatsoever.

CROSS-REFERENCES TO RELATED APPLICATIONS

This application claims benefit of U.S. Provisional Patent Application No. 62/101,430, dated Jan. 9, 2015, and which is hereby incorporated by reference.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates generally to the field of power distribution systems. More particularly, the present invention relates to low-profile power shelves incorporating one or more switch mode power supplies providing a relatively low DC output voltage (e.g. 12V) at very high current (e.g. 1500 A) to power servers, storage or networking equipment.

With ever-increasing power consumption demands in server equipment, for example, increasing or at least more reliable airflow rates are needed to effectively cool such high power distribution systems. The associated electrical components are typically cooled by air moving in parallel airflow channels, through convection or otherwise forced-air mechanisms (e.g., fans or blowers).

However, particularly with respect to certain low-profile configurations (e.g., single "1U" rack units) the airflow channels are often restricted in size, thereby stressing the cooling abilities of the system. This may be even further exacerbated by the typical presence of electrical components, data cables and power cables which are disposed alongside the necessary bus bars. Still further, conventional cooling tools such as heat sinks with dedicated forced-air mechanisms typically require a height profile which is incompatible with for example a 1U power shelf.

BRIEF SUMMARY OF THE INVENTION

Briefly stated, an arrangement of bus bars is provided in a low profile power shelf where the buses are arranged one behind each other. The electrical connection of the rear bus bar is established by a substantially round pin protruding from the front bus bar and being isolated from the front bus bar. The bus bar arrangement uses less than 50% of the total shelf height.

An exemplary embodiment of a bus bar system involves the usage of two substantially rectangular copper or aluminum bus bars of the same size and arranged one behind the other in the shelf. The bus bars occupy only a first portion of the low profile shelf height (typically 50%), leaving the rest open so that the remaining shelf height can be used for other electrical connections and, significantly, allowing cooling air to pass from or to power supplies disposed within the power shelf assembly. This air will at the same time also cool the first and second (i.e., positive and negative connection) bus bars.

The electrical connection from the bus bars to the power supplies may be established by substantially round pins, wherein the single or multiple pin(s) connecting the rear bus bar to associated power supply outputs are protruding through corresponding apertures in the front bus bar. The pins can have an additional isolating material around them to avoid electrical short circuits. The front bus bar is connected through similar pins directly to associated power supply outputs.

This arrangement allows arrangement of the bus bars one behind the other instead of having them one on top of the other.

The proposed arrangement further preferably leaves enough space in the cross section of the shelf for additional low profile components and for air passing through the shelf to cool the power supply units and at the same time also the bus bars.

A power distribution system implementing such an arrangement may include, e.g., six power supplies each providing 3 kW of power at an output voltage of, e.g., 12V. This results in a total output current of 6×250 A=1500 A. The overall height of the low profile shelf is one rack unit (i.e., 1U or ~40 mm). A copper bus bar conducting 1500 A of current without generating excessive losses should not be loaded with more than ~3 A per $mm^2$ cross section. This results in a required bus bar cross section of at least 500 $mm^2$. With the proposed arrangement, a bus bar of 20×25 mm can be selected, at least theoretically leaving >50% of the shelf cross section for other electrical connections and the air flow through the shelf.

The arrangements of bus bars one behind the other allows to reduce significantly the height occupied by such bar bars and allows for increased power outputs in low profile 1U shelves.

BRIEF DESCRIPTION OF THE SEVERAL VIEWS OF THE DRAWINGS

FIG. 5A is an overhead view of the embodiment of the bus bar configuration in FIG. 3.

FIG. 5B is a front view of the embodiment of the bus bar configuration in FIG. 3.

DETAILED DESCRIPTION OF THE INVENTION

Figure 1A:
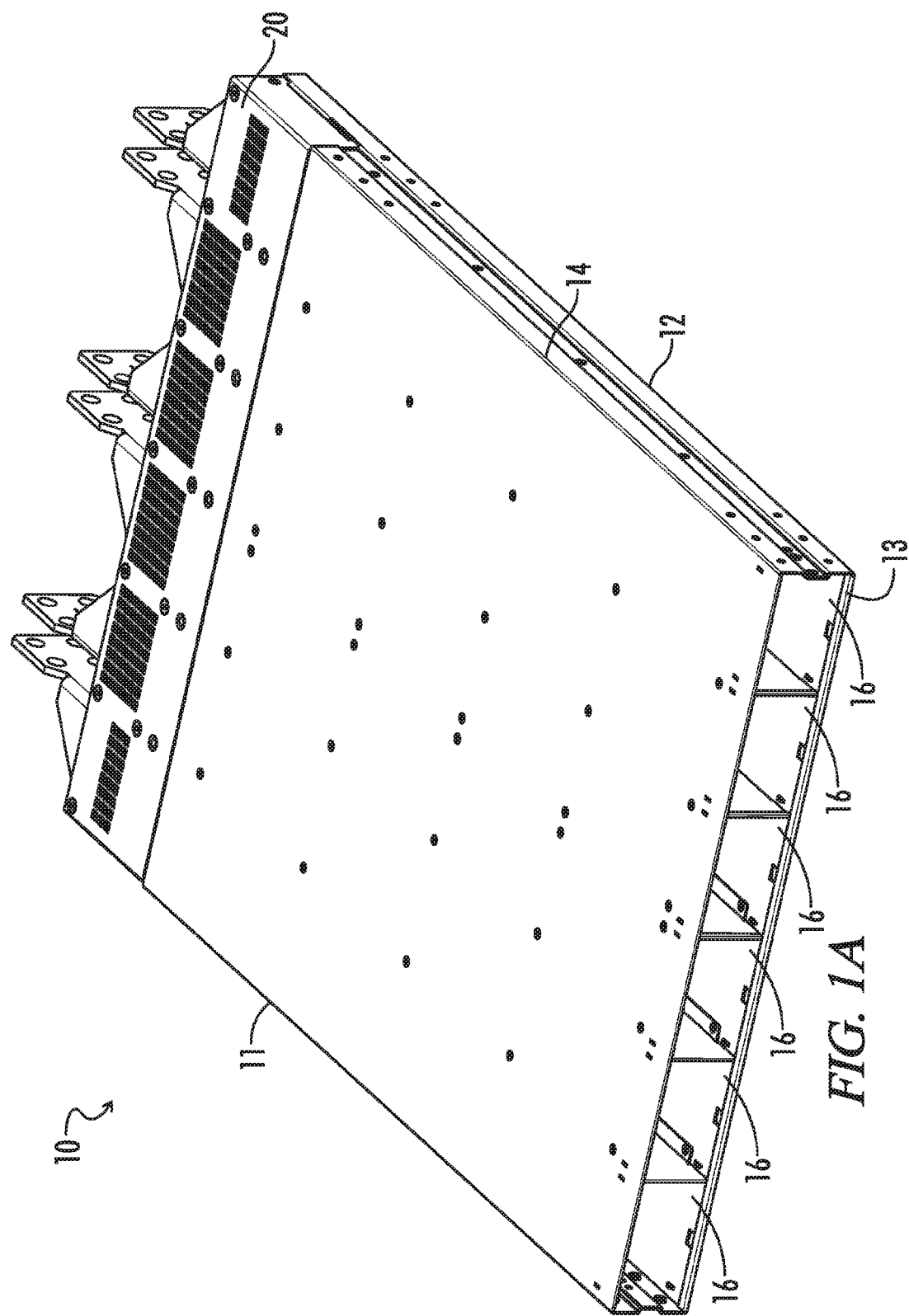
FIG. 1A is an exterior perspective view representing an embodiment of a power shelf assembly with an exemplary bus bar configuration according to aspects of the present invention.
Figure 1B:
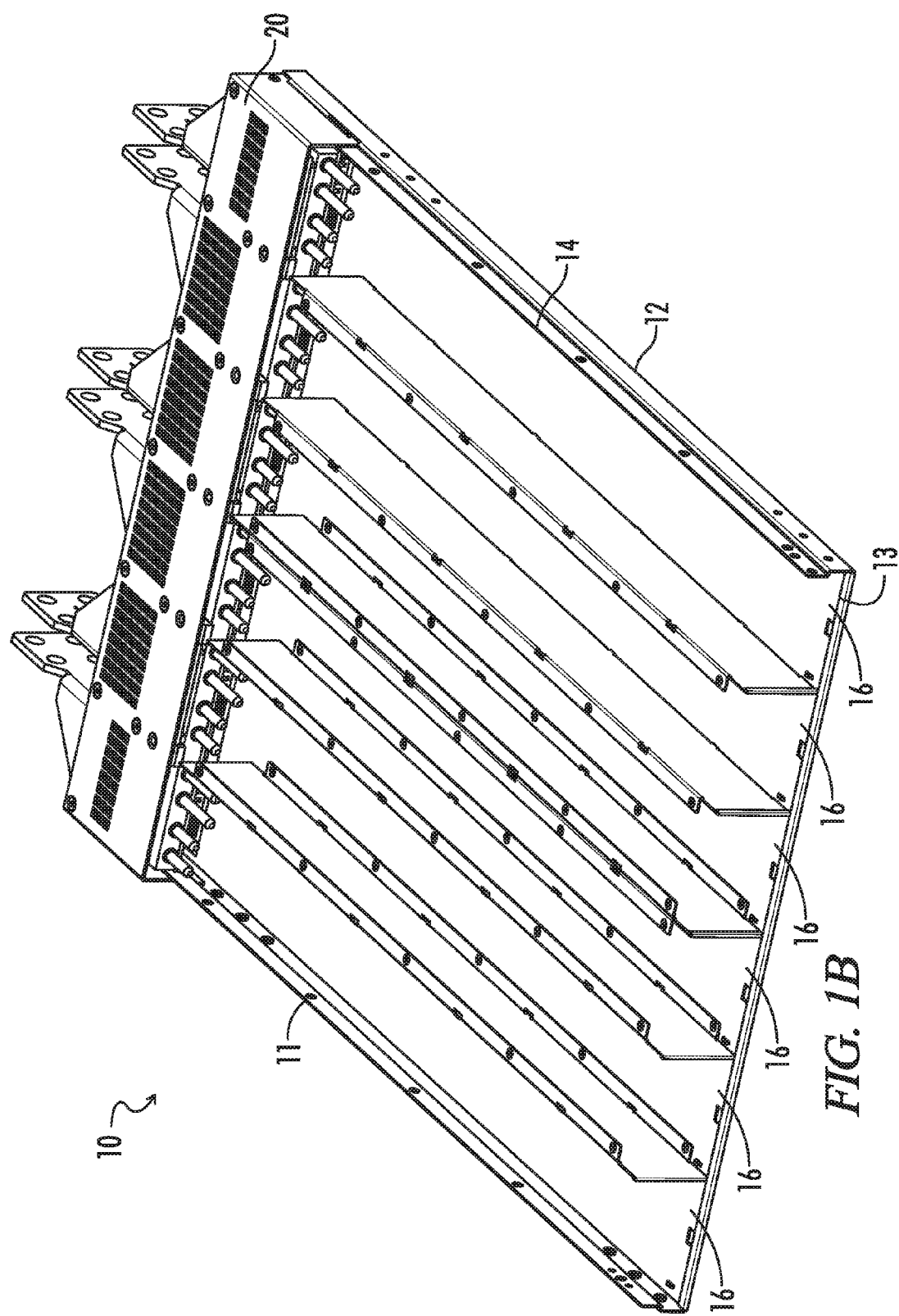
FIG. 1B is a perspective view representing an interior of the embodiment of the power shelf assembly of FIG. 1A.
Figure 2:
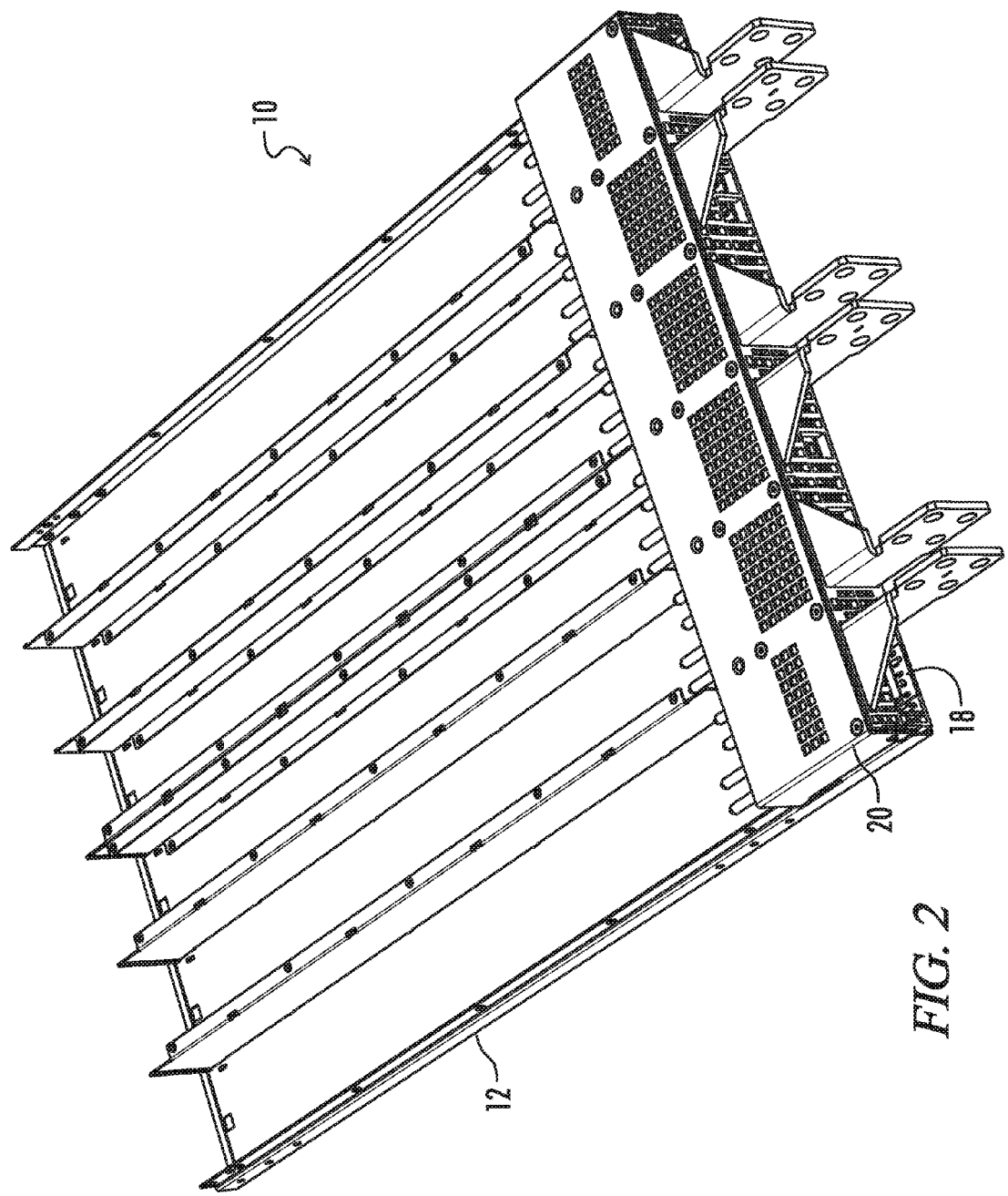
FIG. 2 is a reverse perspective view of the power shelf assembly in FIG. 1B.

Referring generally to FIGS. 1A-7, various exemplary embodiments of an invention may now be described in detail. Where the various figures may describe embodiments sharing various common elements and features with other embodiments, similar elements and features are given the same reference numerals and redundant description thereof may be omitted below.

An exemplary embodiment as disclosed herein and further with reference generally to FIGS. 1A-7 relates to high power density power shelves, as used for example in server systems to convert AC power to the required DC power at low voltage, high current of the servers. To reach high power densities, low profile 1U (~40 mm) shelves are used in conjunction with high power density switching power supplies. The increased power requirements of server systems further require heavy copper bus bars to carry supply currents in the excess of 1500 A from such shelves.

An exemplary bus bar configuration as disclosed herein allows the output currents from each power supply unit in a low profile shelf assembly to be collected in such a way that minimal height in the shelf is used for the overall bus bar system, leaving enough space for other connections and, more importantly, leaving enough space for air to cool the power supply units in the shelf.

Referring first to FIG. 1A. 1B and 2, an exemplary embodiment of a power shelf assembly 10 includes a housing defining a low profile interior having a height of, e.g., 1U (corresponding to the standard height of one shelf in a power supply rack, about 44.5 mm). The assembly may further define one or more channels 16 to receive a like number of power supply units on a first end of the housing, and further is configured to receive a bus bar arrangement 20 on a second end.

As illustrated herein, the housing may be referred to as having a left side 11, a right side 12, a bottom 13 and a top defined by a lid 14, but the associated perspective view is for illustrative purposes only and is not intended as limiting an arrangement or orientation of the assembly 10. While a power shelf assembly 10 is generally described herein in the context of having an interior defined by an enclosure on all but one side, a power shelf assembly may within the scope of the present invention further encompass a power shelf of a single rack unit among many in, for example, a server rack having a stacked plurality of rack units, and without specific reference to a floor, lid or sides defining or otherwise requiring an enclosed interior. Indeed, an exemplary power shelf assembly 10 may within the scope of the present invention be generally defined with respect to a spatial configuration and orientation of a bus bar arrangement 20 as further disclosed herein, relative to one or more power supply units which may be received and coupled thereto. One of skill in the art may appreciate that the term "shelf" as used herein may include any element or combination of elements supporting required objects or components as disclosed herein, and may be shaped to be not only rectangular but potentially square, or even having curved contours at one or more edges.

The housing further may be configured with a number of external signal connections 18 (FIG. 2) disposed on a rear side of the assembly, or otherwise opposing the side configured to receive the power supply units.

Figure 3:
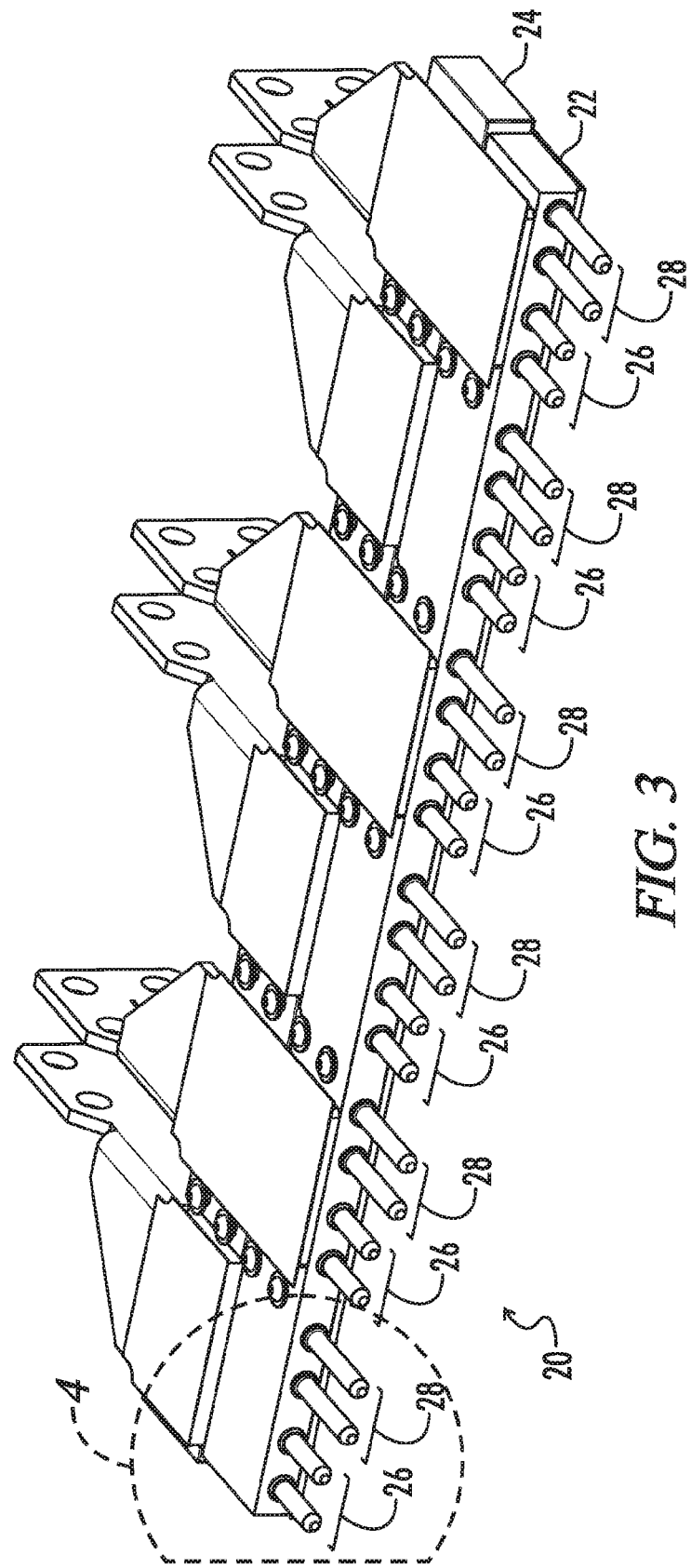
FIG. 3 is a perspective view of an embodiment of the bus bar configuration from the power shelf assembly in FIG. 1B.
Figure 4:
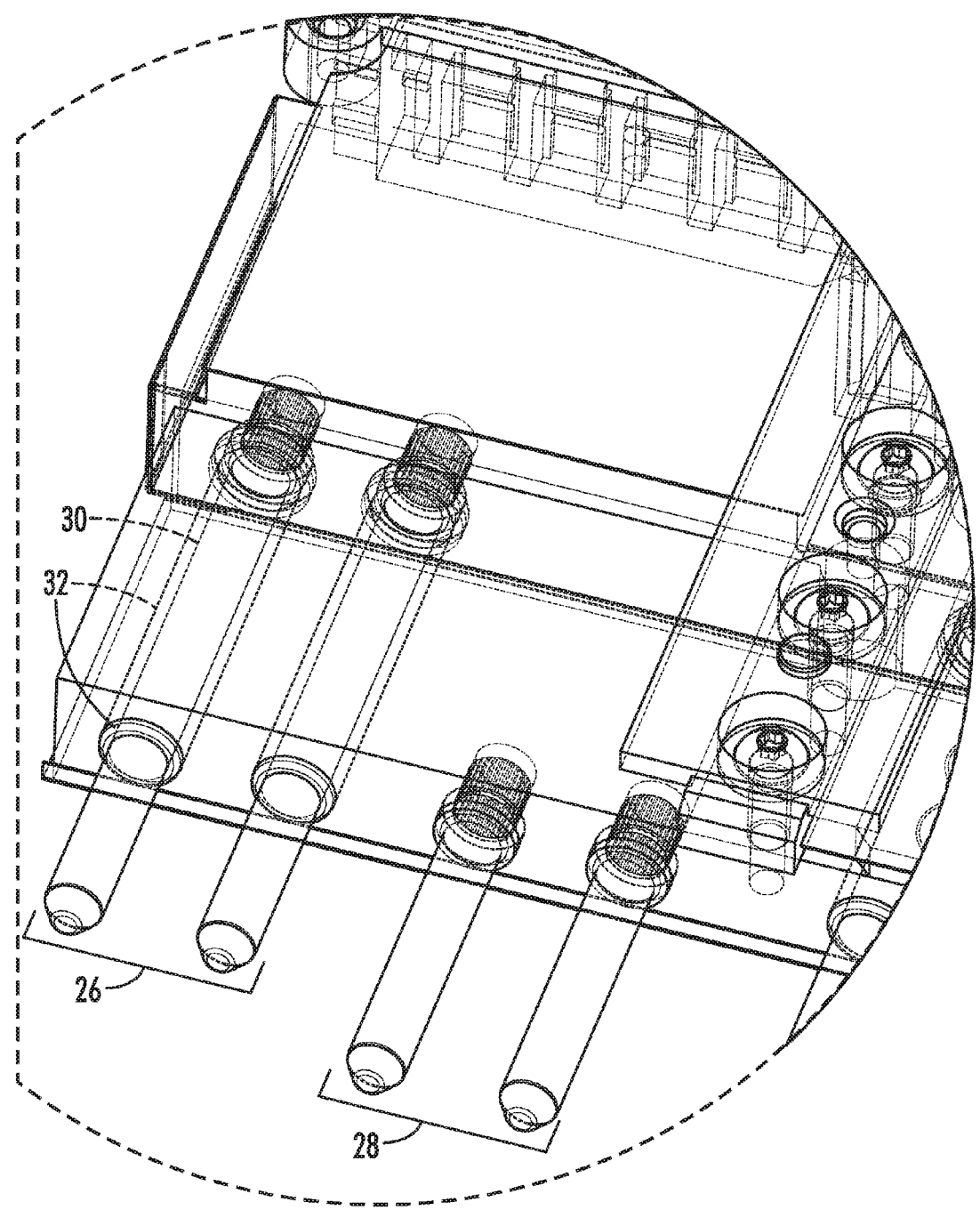
FIG. 4 is an enhanced perspective view of the embodiment of the bus bar configuration in FIG. 3.
Figure 5C:
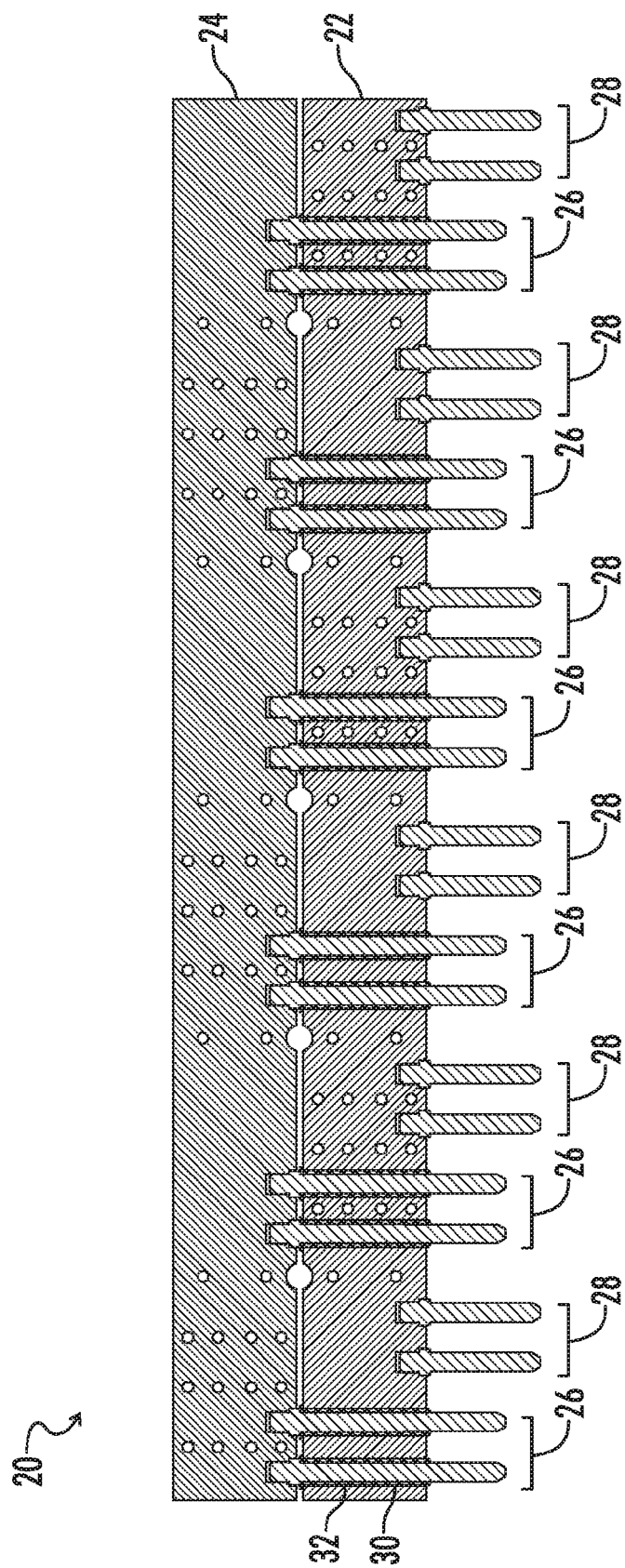
FIG. 5C is a cross-sectional overhead view of the embodiment of the bus bar configuration in FIG. 3.

Referring to FIG. 3, an embodiment of a bus bar arrangement 20 as disclosed herein is configured so as to occupy only a first (e.g., upper) portion of the respective end of the power shelf assembly 10. A first bus bar 22 may extend substantially across the power shelf assembly and in parallel with the bottom 13 and top 14 of the assembly 10. A second bus bar 24 also extends along the same plane and may be mounted directly behind the first bus bar 22, wherein a substantially identical height profile of the low profile shelf assembly is occupied by the bus bars.

In an embodiment, the bus bars 22, 24 may be substantially rectangular copper or aluminum bus bars of the same size, collectively occupying 50% or less of the available height (i.e., as defined between the bottom and top of the interior).

A first set of bus bar pins 28 is coupled to the first bus bar 22 and extends in parallel with the bottom and top planes of the assembly toward the channels 16 for direct coupling with any associated power supply units. A second set of bus bar pins 26 is coupled to the second bus bar 24 and extends in parallel with the first set of pins 28, wherein a single row of pins 26, 28 extends for electrical coupling with the power supply units.

The first set of pins may collectively differ in length from the second set of pins, either based on structural requirements for the power supply units to be implemented, or to implement a specific contact sequence when a power supply is plugged in or out or otherwise simply to facilitate visual distinction between the respective pins by technicians. In various embodiments, however, the various pins may have substantially identical cross-sectional shapes and sizes.

One or more coupling devices may further be provided for coupling each bus bar 22, 24 to the assembly 10 and/or external connections thereto, including for example but not limited to respective brackets, fasteners, hinges, rails and the like.

Referring now to FIGS. 4, 5A, 5B and 5C, in one embodiment the second set of pins 26 extends from the second bus bar 24 through corresponding apertures 30 in the first bus bar 22 and accordingly protrudes the first bus bar 22 and toward the power supply units. In an embodiment, an insulating material 32 is provided about at least the second set of pins 26 with respect to at least the corresponding apertures in the first bus bar 22, wherein electrical short circuits may be avoided.

Figure 6:
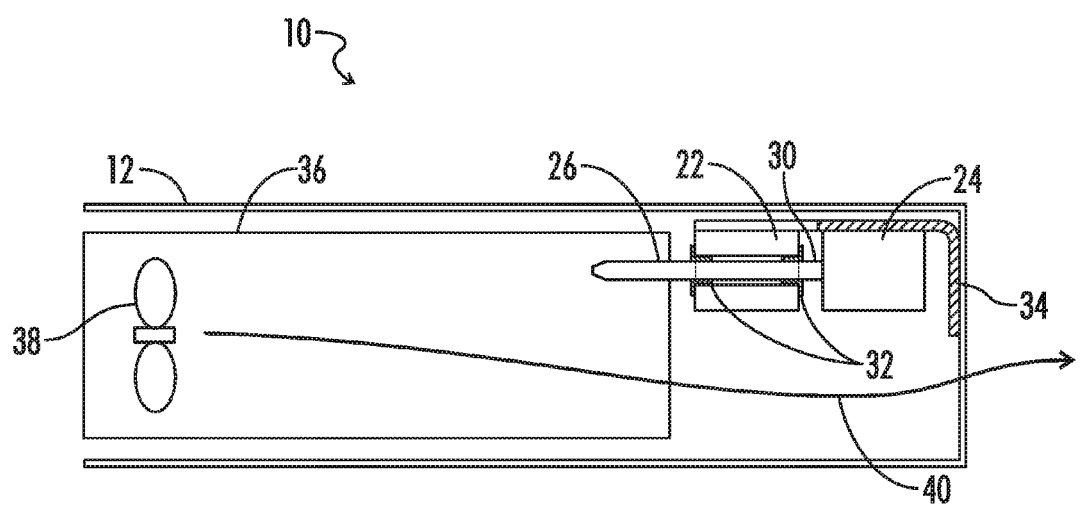
FIG. 6 is a diagram representing an embodiment of a power shelf assembly of the present invention, having an exemplary bus bar configuration interacting with a power supply disposed therein.

In a particular example, and by further reference to FIG. 6, the assembly 10 as described may include, e.g., six power supply units 36 each providing 3 kW of power at an output voltage of, e.g., 12V. This results in a total output current of 6×250 A=1500 A. The overall height of the low profile shelf 10, as previously noted, is one rack unit (i.e., 1U or ~40 mm). A copper bus bar 22, 24 conducting 1500 A of current without generating excessive losses should not be loaded with more than ~3 A per $mm^2$ cross section. This results in a required bus bar cross section of at least 500 $mm^2$. With the proposed arrangement, a bus bar of 20×25 mm can be selected, at least theoretically leaving the aforementioned >50% of the shelf cross section for air flow 40 through the shelf, as may for example be generated or otherwise facilitated by convection cooling or forced-air cooling.

In various embodiments a cooling mechanism may be provided in the form of, for example, cooling fans 38 associated with power supply units 36 themselves, which may be oriented to regulate air flow in any of one or more directions. In other embodiments, cooling may be facilitated from outside of the assembly and further via the air channel proximate the bus bars, as well as air intakes and exhaust portions associated with the assembly housing and the power supply unit.

Figure 7:
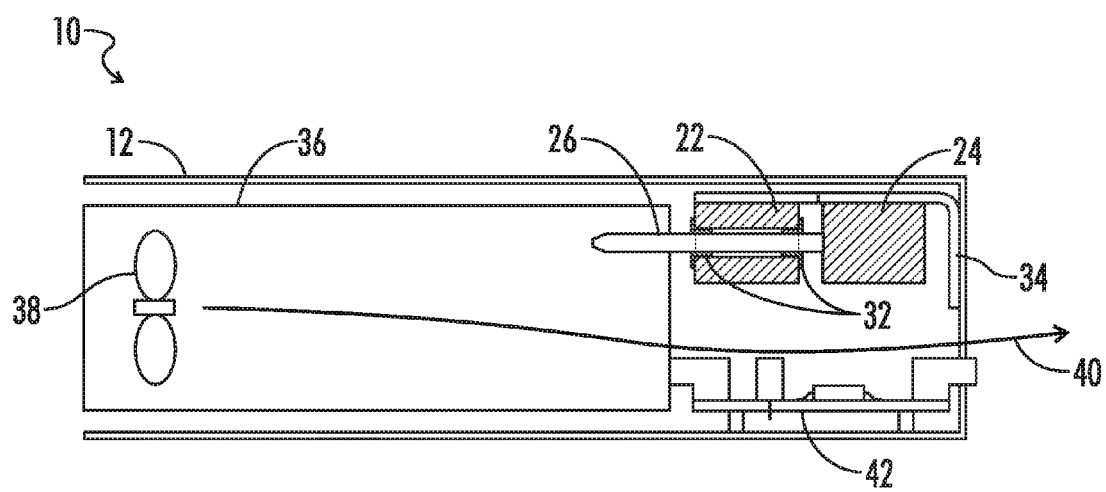
FIG. 7 is a diagram representing an embodiment of a power shelf assembly of the present invention, having an exemplary bus bar configuration and printed circuit board interacting with a power supply disposed therein.

In another example, and by reference to FIG. 7, the space between the bus bar configuration 20 and the floor 13 of the assembly 10 may further be implemented for the placement of additional circuit boards 42 or other electrical components. This circuitry 42 may provide, for example, interconnects between external connectors 18 on the shelf 10 and the various power supply units 36, for electrical signals or even the AC (or DC) input power to the power supply units. The cooling air flow 40 may in this example further provide cooling to electrical intermediary connections or other electrical components as may be desirably provided on the printed circuit board 42.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The term "coupled" means at least either a direct electrical connection between the connected items or an indirect connection through one or more passive or active intermediary devices.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A power distribution system comprising:
   a power shelf assembly having a first side, an opposing second side, and a defined interior between the first and second sides, and wherein a height of the assembly comprises one rack unit (1U);
   a first bus bar extending in parallel with planes corresponding to the first side and the second side of the assembly;
   a second bus bar extending in parallel with the first bar and disposed between the first bus bar and the first side of the assembly;
   a first set of one or more power supply pins extending from the first bus bar toward the second side of the assembly and perpendicular with respect to the first bus bar; and
   a second set of one or more power supply pins extending from the second bus bar toward the second side of the assembly and perpendicular with respect to the second bus bar, the second set of power supply pins further protruding through respective apertures in the first bus bar.

2. The power distribution system of claim 1, wherein the first set and the second set of power supply pins are arranged in parallel fashion along a plane extending between the first side and the second side of the assembly.

3. The power distribution system of claim 2, wherein the first bus bar and the second bus bar are of substantially identical cross-sectional size and are both disposed along a single row within a first portion of an interior height of the power shelf assembly.

4. The power distribution system of claim 3, wherein the first set and the second set of power supply pins are configured for electrical coupling with one or more power supply units positioned between the first bus bar and the second side of the assembly.

5. The power distribution system of claim 4, further comprising an insulating material disposed about an internal circumference of the apertures in the first bus bar, wherein the second set of one or more power supply pins is electrically insulated from the first bus bar.

6. The power distribution system of claim 4, wherein the first portion of the height of the assembly comprises 50% or less of the height of the power shelf assembly.

7. The power distribution system of claim 6, wherein a second portion of the height of the assembly defines an air channel configured for cooling air passing through the assembly.

8. The power distribution system of claim 7, further comprising a printed circuit board mounted within the second portion of the height of the assembly, wherein a space between the bus bars and the printed circuit board defines the air channel.

9. The power distribution system of claim 8, wherein the printed circuit board comprises one or more electrical communications signal interconnects between the one or more power supply units and respective connectors disposed along an exterior of the first side of the assembly.

10. The power distribution system of claim 8, wherein the printed circuit board comprises one or more input power interconnects between the one or more power supply units and respective connectors disposed along an exterior of the first side of the assembly.

11. A power distribution system comprising:
    a power shelf assembly having a first side, an opposing second side, a defined interior between the first and second sides, and one or more channels for receiving power supply units inserted via the second side, wherein a first portion of an interior height of the assembly defines an air channel for cooling air passing through the assembly;
    a first bus bar extending across the defined interior and in parallel with a plane corresponding to the first side of the assembly;
    a second bus bar extending across the defined interior and disposed in parallel between the first bus bar and the first side of the assembly;
    a printed circuit board mounted within the first portion of the height of the assembly, wherein a space between the bus bars and the printed circuit board defines the air channel,
    wherein the printed circuit board comprises one or more electrical communications signal interconnects between the one or more power supply units and respective connectors disposed along an exterior of the first side of the assembly; and
    a plurality of power supply pins arranged in a single row and extending transverse to the plane corresponding to the first side of the assembly, the pins configured for electrical coupling with the one or more inserted power supply units, and
    for each of one or more groups of power supply pins corresponding to a number of channels in the assembly, a first set of one or more of the plurality of power supply pins extending from the first bus bar toward the second side of the assembly; and a second set of one or more of the plurality of power supply pins extending from the second bus bar toward the second side of the assembly.

12. The power distribution system of claim 11, wherein the first and second bus bars are disposed within a second portion comprising 50% or less of the height of the power shelf assembly.

13. The power distribution system of claim 11, wherein the printed circuit board comprises one or more input power interconnects between the one or more power supply units and respective connectors disposed along an exterior of the first side of the assembly.

14. A power distribution system comprising:

a power shelf assembly of one rack unit (1U) having a first side, an opposing second side, third and fourth opposing sides extending between the first and second sides, and a top and a bottom defining a height;

a first bus bar extending between the third and fourth sides and in parallel with the bottom of the assembly, and residing within a first portion comprising 50% or less of the height of the assembly;

a second bus bar extending in parallel with the first bar and disposed within the first portion of the height of the assembly, and between the first bus bar and the first side of the assembly;

a plurality of power supply pins arranged in a single row parallel with the bottom of the assembly, and extending transverse to a plane corresponding to the first side of the assembly, wherein one or more of the plurality of power supply pins extends from the first bus bar toward the second side of the assembly, and wherein each of a remaining one or more of the plurality of power supply pins extends from the second bus bar toward the second side of the assembly.

15. The power distribution system of claim 14, further comprising a printed circuit board mounted within a second portion of the height of the assembly, wherein a space between the bus bars and the printed circuit board defines an air channel for cooling air passing through the assembly.

* * * * *